United States Patent
Paul

(10) Patent No.: US 10,670,683 B2
(45) Date of Patent: Jun. 2, 2020

(54) METHOD AND MAGNETIC RESONANCE APPARATUS FOR RECORDING MAGNETIC RESONANCE DATA USING A BSSFP SEQUENCE

(71) Applicant: Siemens Healthcare GmbH, Erlangen (DE)

(72) Inventor: Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 281 days.

(21) Appl. No.: 15/628,991

(22) Filed: Jun. 21, 2017

(65) Prior Publication Data

US 2017/0363701 A1    Dec. 21, 2017

(30) Foreign Application Priority Data

Jun. 21, 2016  (DE) .................... 10 2016 211 032

(51) Int. Cl.
| | |
|---|---|
| *G01R 33/561* | (2006.01) |
| *G01R 33/48* | (2006.01) |
| *G01R 33/56* | (2006.01) |
| *G01R 33/565* | (2006.01) |

(52) U.S. Cl.
CPC ....... *G01R 33/5614* (2013.01); *G01R 33/482* (2013.01); *G01R 33/565* (2013.01); *G01R 33/5607* (2013.01)

(58) Field of Classification Search
None
See application file for complete search history.

(56) References Cited

U.S. PATENT DOCUMENTS

| | | | |
|---|---|---|---|
| 2009/0326367 A1 | 12/2009 | Doyle et al. | |
| 2011/0260725 A1* | 10/2011 | Mordini | G01R 33/56325 324/309 |
| 2012/0249144 A1 | 10/2012 | Rehwald et al. | |
| 2012/0256625 A1* | 10/2012 | Block | G01R 33/4828 324/309 |
| 2013/0271128 A1* | 10/2013 | Duerk | G01R 33/5611 324/307 |
| 2014/0292325 A1 | 10/2014 | Heule et al. | |
| 2015/0091563 A1 | 4/2015 | Zenge | |
| 2015/0226823 A1* | 8/2015 | Speier | G01R 33/34092 324/309 |
| 2017/0219672 A1* | 8/2017 | Miyazaki | G01R 33/4816 |
| 2019/0086500 A1* | 3/2019 | Koestler | G01R 33/5614 |

OTHER PUBLICATIONS

Scheffler et al., "Principles and Applications of Balanced SSFP Techniques," European Radiology, vol. 13 (2003), pp. 2409-2418.

* cited by examiner

*Primary Examiner* — Jermele M Hollington
(74) *Attorney, Agent, or Firm* — Schiff Hardin LLP

(57) ABSTRACT

In a method and magnetic resonance apparatus for recording magnetic resonance data using a bSSFP sequence, a k-space line to be scanned in k-space is divided into at least two line sections, with at least two of the at least two line sections being scanned separately in different repetitions of the sequence.

7 Claims, 3 Drawing Sheets

METHOD AND MAGNETIC RESONANCE APPARATUS FOR RECORDING MAGNETIC RESONANCE DATA USING A BSSFP SEQUENCE

BACKGROUND OF THE INVENTION

Field of the Invention

The invention concerns a method for recording magnetic resonance data using a bSSFP sequence with a magnetic resonance apparatus, as well as a magnetic resonance apparatus, and a non-transitory data storage medium encoded with programming instructions, for implementing such a method.

Description of the Prior Art bSSFP sequences (balanced steady-state free precession sequences), also known as "True FISP", "FIESTA" and "T2-FFE" for instance, are widely known in magnetic resonance imaging. A bSSFP sequence is a coherent balanced sequence, in which balanced gradients are used, namely for all three axes. Here the term "balanced" means that the gradient-induced dephasing is canceled during a complete repetition of the sequence, in other words a complete TR interval. In unbalanced FFSP sequences, the gradients are unbalanced, which means that separate FID (free induction decay) and echo components of the free precession signal can be recorded in balance. With a bSSFP sequence, however, the balanced gradients refocus both components at the exact center of the repetition time interval (TR interval) as a single echo. Basic information relating to the bSSFP sequence can be found in an article by Klaus Scheffler and Stefan Lehnhardt for instance, "Principles and applications of balanced SSFP techniques", Eur Radiol (2003) 13:2409-2418. bSSFP sequences are widely used in magnetic resonance imaging if short total recording times ("fast imaging") are involved. Fields of application include cardiac imaging and body imaging. The bSSFP sequence benefits from a high read-out efficiency due to the short echo times (TE) and repetition times (TR), which are on the order of milliseconds. A further advantage of bSSFP is the high signal-to-noise ratio that is achieved therewith.

One problem that arises with bSSFP imaging, however, is that the recording technique responds very sensitively to field inhomogeneities, which may result in image faults known as banding artifacts. If these banding artifacts occur in the region of interest, this can make a correct diagnosis more difficult. Approaches to reduce the banding artifacts have been proposed, but many of these approaches are disadvantageous because they significantly increase the total recording time (scan time).

US 2014/0292325 A1 describes a magnetic resonance imaging method for quantifying T1 and/or T2 repetition times in a sample, in which, inter alia, the recording time is to be kept short. The use of an unbalanced bSSFP sequence with gradients known as crusher gradients is proposed, in order to dephase the residual transversal magnetization. In such cases three signals are recorded, namely an SSFP FID signal of the first order, an SSFP FID signal of the lowest order and an SSFP echo signal of the lowest order, from which T1 and T2 can be determined. Extremely short repetition times TR, shorter than 20 ms for instance, can be used here.

SUMMARY OF THE INVENTION

An object of the invention is to specify recording magnetic resonance data with a bSSFP sequence by making the recording less influenced by inhomogeneities and is thus of higher quality.

This object is achieved by the method in accordance with the invention for recording magnetic resonance (MR) data by operating an MR scanner with a control computer in order to execute a number of repetitions of a bSSFP sequence, and wherein the control computer enters the acquired MR data into a memory organized as k-space, with a k-space line to be scanned (filled with acquired MR data) in k-space being divided into at least two line sections, and at least two of the at least two line sections are scanned separately in different repetitions of the bSSFP sequence.

The data entered into k-space in this manner are then made available from the control computer as a data file.

The idea underlying the invention is that, by segmenting the scanning processes, the repetition time TR is reduced even further than would otherwise be possible with bSSFP sequences. While conventional imaging with bSSFP sequences scans a complete line or row in the k-space to be read out, the associated gradient pulse sequences have a specific length in order to apply the gradient moment, so an analog-digital converter must additionally be opened for a specific time for reading out the MR data in order to be able to enter all magnetic resonance signals of the k-space line into that k-space line. With Cartesian scanning of k-space, in order to be able to scan a complete k-space line, a gradient pulse must first be used in order to reach the start of the k-space row to be scanned in the read-out direction, which typically extends symmetrically about the k-space center in the read-out direction. A further gradient pulse with an inverted sign, known as the read-out gradient, is then activated, and while this is present the read-out of the magnetic resonance signals typically also takes place via the analog-digital converter. The read-out gradient pulse is maintained and magnetic resonance signals are read out until the end of the particular k-space line to be read out is reached, which typically faces the start with respect to the k-space center. A further gradient pulse with an inverted sign is then required in order again to revert back to the k-space center in the read-out direction, and thus to avoid dephasings. Since gradients are contained in terms of the amplitude and the slew rate, a specific period of time is essential for the read-out process, which depends overall on the resolution and the system properties. The total of all gradient durations defines the repetition time TR of the acquisition with the bSSFP sequence.

The invention now proposes to perform a read-out segmentation, wherein each k-space line to be read out is divided into a number of portions, the line sections, wherein all parts are to be read out in different repetitions. In this way a shorter read-out module can be achieved in the repetition since fewer gradient moments, therefore movements in the k-space in the read-out direction, are required and the duration of the gradient pulse sequence and of the read-out window is thus significantly reduced. The various line sections are recorded in separate repetitions, in other words separate echoes, of the bSSFP sequence and are then merged accordingly during the image reconstruction.

Because the repetition time TR for the segmented read-out process can be selected to be considerably shorter, fewer banding artifacts can occur due to inhomogeneities and the image quality is increased. The probability of acquisition of unusable magnetic resonance data is significantly reduced.

It should be noted that the recording technique in accordance with the invention can also be used particularly advantageously for less powerful magnetic resonance scanners with slow or less powerful gradient systems and/or restricted shim systems, since these entail a particularly high risk of banding artifacts, which can be reduced by the inventive division of the read-out process for k-space lines.

Expediently in such cases, Cartesian scanning of k-space can take place and/or the k-space line can traverse the entire k-space to be scanned. Cartesian scanning of k-space is used more frequently for bSSFP sequences, wherein k-space lines, known as k-space rows, which follow one another in the phase encoding directions for instance, and extend in the read-out direction, can be scanned, and also define k-space to be scanned in terms of their length. Nonetheless the method can also be applied, for instance, with at least partial radial scanning of k-space.

It is particularly advantageous if a k-space line to be scanned is divided into an odd number of line sections. While in principle the k-space line can be divided into any number of line sections, odd numbers are preferable because the k-space center is then scanned in the center of the read-out process assigned to an echo, and is thus uninfluenced by edge effects. A k-space line may be divided into three, five, seven or more line sections for example, depending on how much of a time gain is desirable during the repetition time.

With the bSSFP sequence, in order to avoid dephasings, the read-out is typically carried out such that the k-space center is traversed repeatedly in the read-out direction. Therefore, in an embodiment of the present invention, the read-out gradient pulses used to read out the line sections each end at the k-space center in the read-out direction. Modifications to a line section that is asymmetric in the read-out direction with respect to the k-space center are ideally performed here so that an excessively large number of switchover processes or individual gradient pulses of the read-out gradient is avoided. In another embodiment, for a line section that ends before reaching the k-space center in the read-out direction, the duration of the gradient pulse at which the read-out of the magnetic resonance signals takes place is extended until the k-space center is reached and/or, for a line section of the gradient pulse that starts after the k-space center in the read-out direction, the read-out of the magnetic resonance signals is started at the k-space center. Overall, the read-out modules can vary depending on the position of the line sections, wherein a gradient pulse with an inverse sign, which may result in a further shortening of the duration of the read-out module, can be omitted for line sections which end before the k-space center or start after the k-space center.

It should be noted again that the k-space line is preferably divided into line sections of equal length and/or at least symmetrically in order to enable possible repetition times to be as comparable as possible for all repetitions.

In an embodiment of the invention not all line sections, into which a k-space line was divided, are measured, but rather at least one side of the k-space center is completely scanned in the read-out direction. Missing portions of the k-space line can be obtained using the Hermitian symmetry of the magnetic resonance data that is ideally present. While in the case of a k-space line that extends symmetrically around the k-space center, theoretically only half of this k-space line thus must actually be completely scanned. In practice more k-space data are acquired than the amount theoretically required, in order to be able to compensate for imperfections, for instance phase errors. An undersampling along a k-space line in the read-out direction is frequently also referred to as "partial Fourier" or asymmetric echo. Undersampling in the read-out direction permits the total recording time for the magnetic resonance data to be reduced further.

In addition to the method, the present invention also encompasses a magnetic resonance apparatus having a control computer designed to implement the inventive method. All explanations relating to the inventive method apply to the inventive magnetic resonance apparatus, with which the advantages already indicated can consequently also be obtained.

The present invention also encompasses a non-transitory, computer-readable data storage medium encoded with programming instructions that, when the storage medium is loaded into a control computer of a magnetic resonance apparatus, cause the control computer to operate the magnetic resonance apparatus in accordance with one or more of the above-described embodiments of the method according to the invention.

The data carrier (storage medium) can be a CD ROM, for example.

DESCRIPTION OF THE PREFERRED EMBODIMENTS

Figure 1:
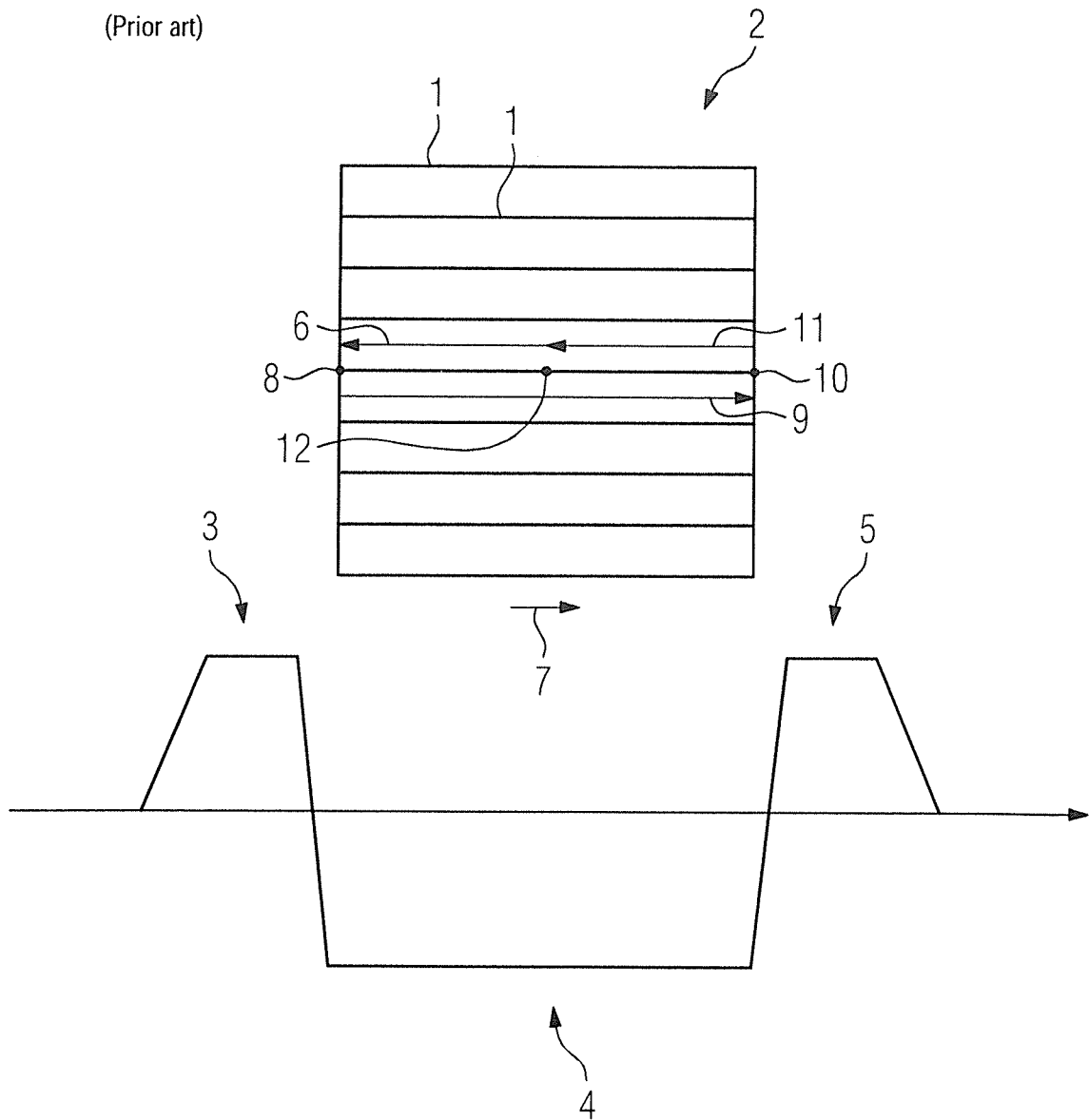
FIG. 1 illustrates the scanning of a k-space line according to the prior art.

FIG. 1 illustrates the scanning of k-space lines 1 of k-space 2 to be scanned in a bSSFP sequence according to the prior art. Three gradient pulses 3, 4 and 5 of the read-out gradient, which are used in the read-out module, are shown. The gradient pulse 3 is used in order to reach the start point 8 of the current k-space line 1 to be read out in accordance with the arrow 6 in the read-out direction 7. Throughout the duration of the gradient pulse 4, k-space 2 is traversed in the read-out direction 7 according to the arrow 9 and magnetic resonance signals are read out using an analog-digital converter, until the end point 10 of the current k-space line 1 to be scanned is reached. The gradient pulse 5 is then used in order, according to the arrow 11 toward the end of the read-out module, to return once again to the k-space center 12 in the read-out direction.

It is precisely in magnetic resonance scanners with less powerful gradient systems, in which therefore the amplitude and the slew rate of the gradient pulses 3, 4, 5 are restricted, that the duration of this read-out module significantly contributes to the repetition time. With longer repetition times a larger number of banding artifacts may occur.

In contrast, in the inventive method shown below, the k-space lines 1 are completely scanned, here in a Cartesian manner, not in a single read-out process (in other words a single repetition), but instead by dividing them into line sections, which can be read out in separate repetitions, in order thus to shorten the duration of the read-out module and therefore the repetition time and to reduce banding artifacts.

Figure 2:
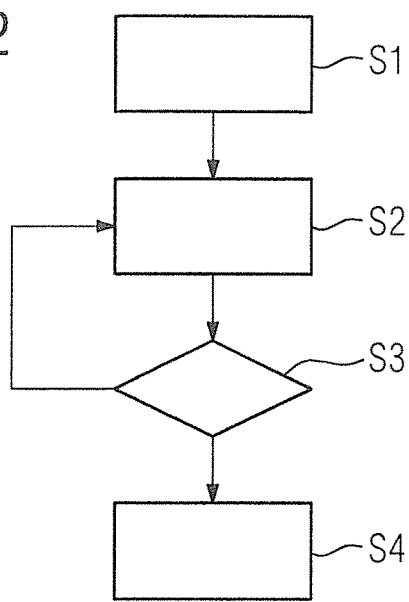
FIG. 2 is a flowchart of an exemplary embodiment of the inventive method.

A flowchart of an exemplary embodiment of the inventive method is shown as an example in FIG. 2.

Here in a step S1 a k-space line 1 to be scanned is divided into an odd number of line sections of equal size. Three line sections are used here to simplify the representation. In order to be able to further reduce the repetition time TR, higher odd numbers can be used in this exemplary embodiment.

In step S2, a first line section of the k-space line to be read out is then read out in a single repetition, in other words a single echo, whereupon in step S3 a check is carried out to determine whether further line sections have to be read out, which can then be scanned accordingly in further repetitions, step S2. This is shown in more detail with the use of FIGS. 3 and 4 together with the adjustment to the gradient pulses to be performed in the read-out modules.

Figure 3:
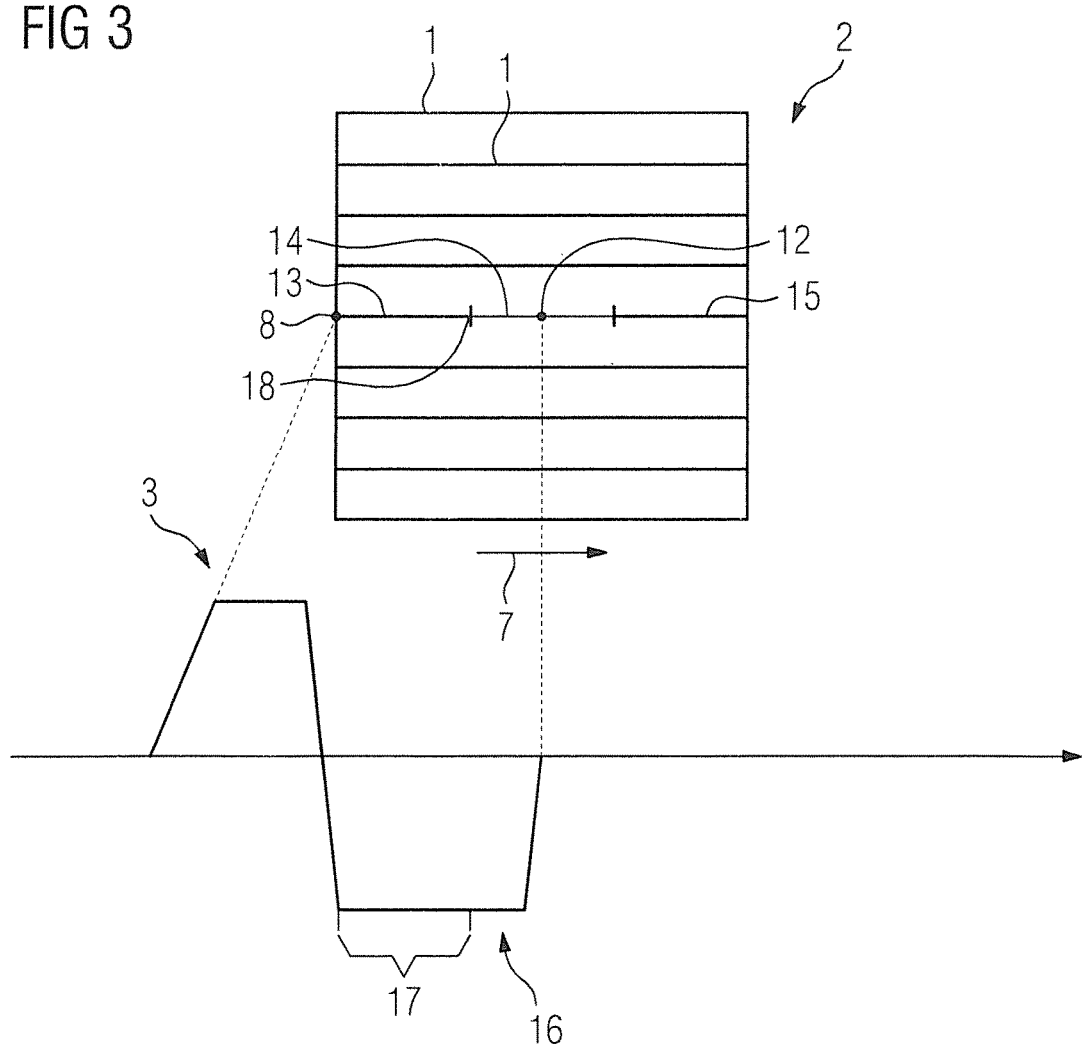
FIG. 3 illustrates a read-out module for a first line section in accordance with the invention.

According to the representation in FIG. 3, a k-space line 1, which is to be scanned, was divided into three line sections 13, 14 and 15 of equal size. Here the middle line section 14 contains the k-space center 12 centrally in the read-out direction 7, which is advantageous. With the gradient pulse sequence in FIG. 3, the first line section 13 should now be scanned. To this end, the gradient pulse 3 in FIG. 1 is first used here unchanged, in order, in turn, to return from the k-space center 12 in the read-out direction 7 to the start point 8 of the k-space line 1 and also of the line section 13. A gradient pulse 16 with an inverse sign, which permits the scanning in the read-out direction, follows the gradient pulse 3. However, the read-out time frame 17 does not cover the total duration of the gradient pulse 16, but instead only lasts until the end point 18 of the line section 13 is reached. The gradient pulse 16 is then maintained, in order in this repetition to thus reach the k-space center 12 in the read-out direction 7.

Figure 4:
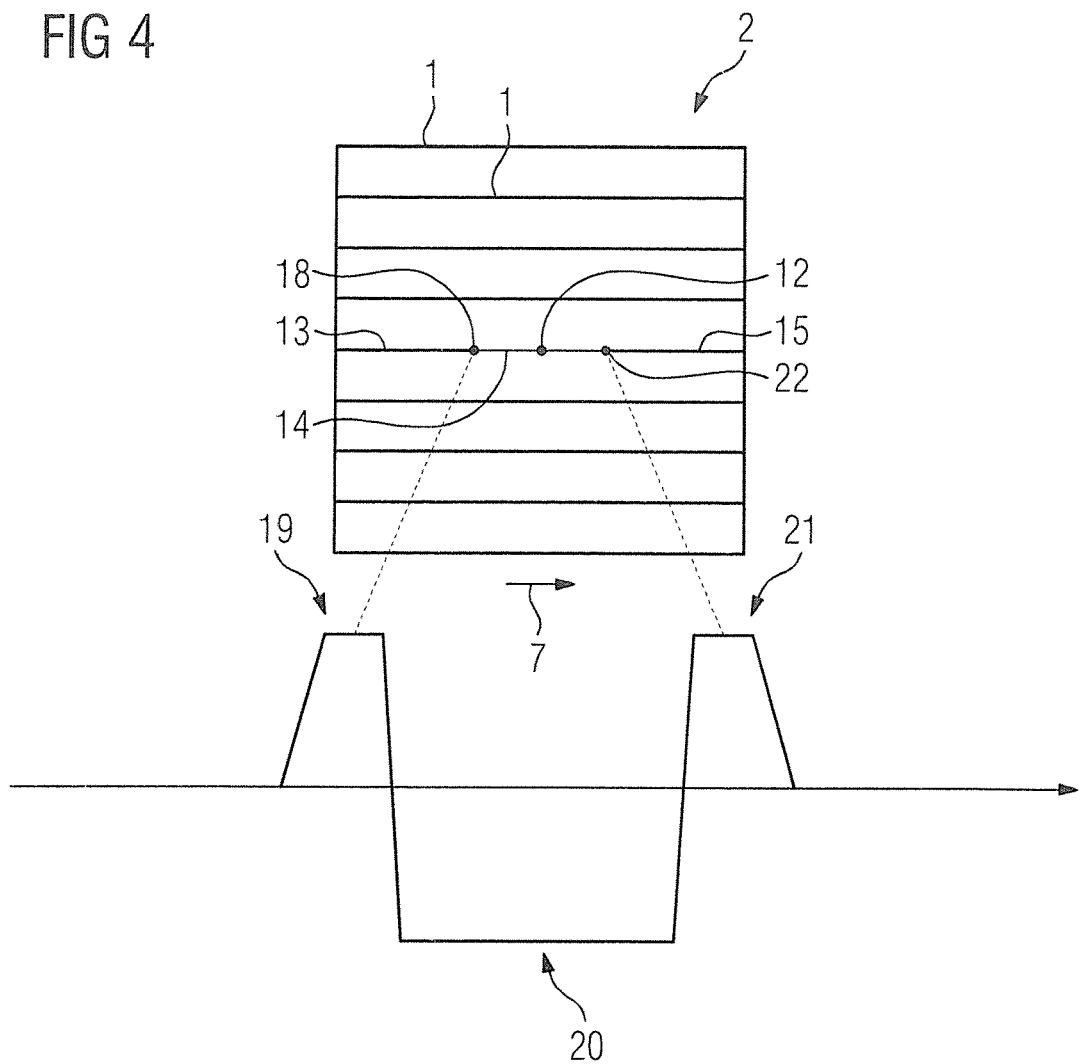
FIG. 4 illustrates a read-out module for a second line section in accordance with the invention.

In a corresponding representation, FIG. 4 shows the read-out module for the central line section 14, the start point of which corresponds to the end point 18 of the line section 13. A gradient pulse 19 which is shorter compared with the gradient pulse 3 is therefore used first in order to reach the start point 18 in the read-out direction 7. Then throughout the duration of the gradient pulse 20 with the inverse sign the read-out process takes place along the line section 14, comprising in its center also the k-space center 12 in the read-out direction 7. After the end point 22 of the line section 14 has been reached, the k-space center 12 in the read-out direction is returned to by way of a further gradient pulse 21.

If the line section 15 is also to be scanned, the gradient pulses 16 and 3 in FIG. 3 would finally be used in reverse order, wherein the read-out time frame naturally only starts when the start point of the line section 15, which corresponds to the end point 22 of the line section 14, is reached. However, to reduce the total recording time it is expedient to perform an undersampling along the k-space line 1 and to entirely omit the scanning of the line section 15, since due to the Hermitian symmetry in the read-out direction 7 in k-space, the data that were not obtained by operation of the scanner nevertheless can be obtained from the scanned magnetic resonance data.

In a step S4 (cf. FIG. 2), the magnetic resonance data of the individual line sections 13, 14 and 15 are then merged and the reconstruction of a magnetic resonance image data record takes place as usual.

Figure 5:
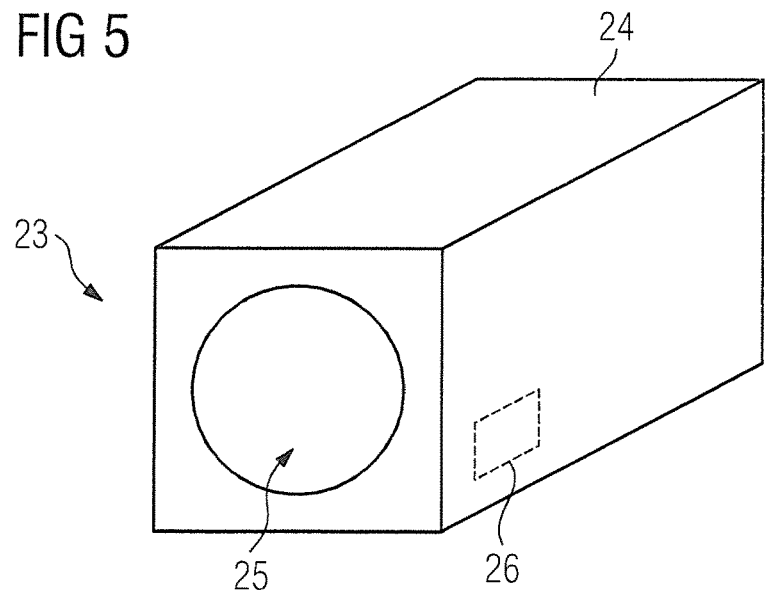
FIG. 5 schematically illustrates an inventive magnetic resonance apparatus.

FIG. 5 shows a block diagram of an inventive magnetic resonance device 23, which, as is known in principle, has a scanner 24, into which a patient can be introduced via a cylindrical patient aperture 25. The patient bed used for this is not shown for simplicity. Typically a radio frequency coil arrangement and a gradient coil arrangement of the scanner 24 are provided that surround the patient aperture 25, which are likewise not shown in more detail for simplicity. Through the activation of the gradient coil arrangement, the read-out gradient pulses described above can be generated.

Operation of the magnetic resonance scanner 24 is controlled by a control computer 26, which is configured to carry out the inventive method. To this end, the control computer 26 can include a division processor for dividing k-space lines into line sections, and a sequence controller for instance, which then performs the corresponding scanning of the line sections in different repetitions by activating the components of the magnetic resonance scanning 24.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for recording magnetic resonance (MR) data, comprising:

using a control computer to operate an MR data acquisition scanner to acquire MR data by executing multiple repetitions of a bSSFP sequence;

using said control computer to enter the acquired MR data into an electronic memory organized as k-space comprising a plurality of k-space lines in said electronic memory, by dividing a k-space line, into which said acquired MR data are to be entered, into at least two line sections, and entering the acquired MR data respectively into at least two of said at least two line sections separately in different repetitions of said bSSFP sequence, wherein said k-space line traverses an entirety of k-space into which said MR data are to be entered; and from said control computer, making the data entered into k-space available in electronic form, as a data file.

2. A method as claimed in claim 1 comprising entering the acquired MR data into k-space by Cartesian scanning of k-space.

3. A method as claimed in claim 1 comprising entering said acquired MR data into k-space by Cartesian scanning of k-space, with said k-space line traversing an entirety of k-space into which said acquired MR data are to be entered.

4. A method as claimed in claim 1 comprising dividing said k-space line into an odd number of line sections.

5. A method as claimed in claim 1 wherein k-space exhibits Hermitian symmetry, and comprising entering the acquired data into only some of said line sections of a k-space line, and thereby producing at least one line section of the k-space line into which acquired MR data have not been entered, and filling said at least one portion of the k-space line, after acquiring said MR data, using said Hermitian symmetry of k-space.

6. A magnetic resonance (MR) apparatus comprising:

an MR data acquisition scanner;

a control computer configured to operate said MR data acquisition scanner to acquire MR data by executing multiple repetitions of a bSSFP sequence;

an electronic memory;

said control computer being configured to enter the acquired MR data into said electronic memory, organized as k-space comprising a plurality of k-space lines in said electronic memory, by dividing a k-space line, into which said acquired MR data are to be entered, into at least two line sections, and entering the acquired MR data respectively into at least two of said at least two line sections separately in different repetitions of said bSSFP sequence, wherein said k-space line traverses an entirety of k-space into which said MR data are to be entered; and said control computer being configured to make the data entered into k-space available in electronic form, as a data file.

7. A non-transitory, computer-readable data storage medium encoded with programming instructions, said storage medium being loaded into a control computer of a magnetic resonance (MR) apparatus comprising an MR data acquisition scanner and an electronic memory, said programming instructions causing said control computer to:

operate the MR data acquisition scanner to acquire MR data by executing multiple repetitions of a bSSFP sequence;

enter the acquired MR data into the electronic memory, organized as k-space comprising a plurality of k-space lines in said electronic memory, by dividing a k-space line, into which said acquired MR data are to be entered, into at least two line sections, and entering the acquired MR data respectively into at least two of said at least two line sections separately in different repetitions of said bSSFP sequence, wherein said k-space line traverses an entirety of k-space into which said MR data are to be entered; and make the data entered into k-space available in electronic form, as a data file.

* * * * *